United States Patent
Auerbach et al.

(10) Patent No.: US 9,495,504 B2
(45) Date of Patent: Nov. 15, 2016

(54) USING TRACES OF ORIGINAL MODEL TO VERIFY A MODIFIED MODEL

(71) Applicant: International Business Machines Corporation, Armonk, NY (US)

(72) Inventors: Gadiel Auerbach, Ramat Hahayal (IL); Fady Copty, Ramat Hahayal (IL)

(73) Assignee: International Business Machines Corporations, Armonk, NY (US)

(*) Notice: Subject to any disclaimer, the term of this patent is extended or adjusted under 35 U.S.C. 154(b) by 0 days.

(21) Appl. No.: 14/267,230

(22) Filed: May 1, 2014

(65) Prior Publication Data

US 2015/0317421 A1 Nov. 5, 2015

(51) Int. Cl.
*G06F 9/455* (2006.01)
*G06F 17/50* (2006.01)

(52) U.S. Cl.
CPC ....... *G06F 17/5081* (2013.01); *G06F 17/5022* (2013.01); *G06F 17/5045* (2013.01)

(58) Field of Classification Search
USPC ........................................................ 716/106
See application file for complete search history.

(56) References Cited

U.S. PATENT DOCUMENTS

| | | | |
|---|---|---|---|
| 8,042,078 B2 | 10/2011 | Paruthi et al. | |
| 8,103,999 B1 | 1/2012 | Martensson | |
| 8,407,641 B2 | 3/2013 | Baumgartner et al. | |
| 8,489,367 B2 | 7/2013 | Auerbach et al. | |
| 8,601,414 B2 | 12/2013 | Andraus et al. | |
| 2005/0188337 A1* | 8/2005 | Baumgartner et al. | 716/6 |
| 2013/0060545 A1 | 3/2013 | Chockler et al. | |

OTHER PUBLICATIONS

Chang et al., "Simulation-Based Bug Trace Minimization With BMC-Based Refinement," IEEE Transactions on Computer-Aided Design of Integrated Circuits and Systems, vol. 26, No. 1, Jan. 2007, pp. 152-165.
Chockler et al., "Incremental Formal Verification of Hardware," FMCAD '11 Proceedings of the International Conference on Formal Methods in Computer-Aided Design, 2011, pp. 135-143.
Dehbashi et al., "Automated Design Debugging in a Testbench-Based Verification Environment," 214th Euromicro Conference on Digital System Design, 2011, pp. 479-486.
Bertacco, "Debugging Strategies for Mere Mortals," DAC '09 Proceedings of the 46th Annual Design Automation Conference, 2009, pp. 635-638.
Gharehbaghi et al., "Error Model Free Automatic Design Error Correction of Complex Processors Using Formal Methods," 2012 IEEE 21st Asian Test Symposium, Nov. 2012, pp. 143-148.

* cited by examiner

*Primary Examiner* — Eric Lee
(74) *Attorney, Agent, or Firm* — Joseph Petrokaitis (57) ABSTRACT

Method, apparatus and product for using traces of an original model to verify a modified model. The method comprising obtaining a trace exemplifying a checker failing in a model; obtaining a modified model, wherein the modified model is a modified version of the model which was modified in an attempt to resolve the checker failing in the model; re-simulating the trace in the modified model to generate a second trace, wherein said re-simulating is performed by a processor; comparing the trace and the second trace to identify a common prefix, wherein the common prefix ends immediately before a cycle in which a state according to the trace is different than a state according to the second trace; and guiding verification of the modified model using values derived from the common prefix.

20 Claims, 4 Drawing Sheets

USING TRACES OF ORIGINAL MODEL TO VERIFY A MODIFIED MODEL

TECHNICAL FIELD

The present disclosure relates generally to verification and, more particularly to verification of a design using traces of a previous version of the design.

BACKGROUND

Verification of computerized systems, such as circuits, chips, or other hardware components is an important part of the quality assurance process. A design of the system may be verified. The design may be provided in a manner defining its functionality, such as using Verilog, Hardware Description Language (HDL), or the like.

Verification techniques include simulation of stimuli to the design, which may be performed using a software simulator, emulator, hardware accelerator, or the like. Simulation may be performed based on the design. Simulation may be purely random, heuristically guided, or the like. During simulation, certain conditions or assertions, also referred to as checkers, may be checked. Checkers may be defined using Property Specification Language (PSL) or other languages. In case the condition is met or the assertion is violated, the simulation may provide the simulated trace exemplifying such an occurrence.

Another verification technique is formal verification during which the design is formally proven to hold a specification property (e.g., AGp property, EFp property, or the like). In case the design does not hold the specification property, a counter-example is provided showing a particular trace in which the design does not hold the property. There are several formal verification techniques, such as but not limited to model checking, theorem proving, equivalence checking, or the like.

Yet another verification technique is semi-formal verification in which formal and non-formal methods are combined. Semi-formal verification may leverage formal algorithms without unlimited resources and may be used to find bugs too complex or deep for pure formal search. One example of semi-formal verification method is symbolic execution in which a group of executions are symbolically represented by a single simulated execution. Another example of semi-formal verification includes iterating between simulation and formal algorithms.

In the present disclosure, all examined properties, be them specification properties, assertions, or the like, are commonly referred to as properties. The present disclosure generally refers to the properties as being checked by checkers.

It is not rare that a verification engineer verifies, using formal, non-formal or semi-formal technique, a design and discovers bugs in the design. The bug may be exemplified in a trace of the design. After the bugs are found, the design may be manually modified, such as by a designer, to correct the design, fix the bug, or the like. However, after the design is modified, it may be desired to verify the modified design as well.

BRIEF SUMMARY

One exemplary embodiment of the disclosed subject matter is a method comprising: obtaining a trace exemplifying a checker failing in a model; obtaining a modified model, wherein the modified model is a modified version of the model which was modified in an attempt to resolve the checker failing in the model; re-simulating the trace in the modified model to generate a second trace, wherein said re-simulating is performed by a processor; comparing the trace and the second trace to identify a common prefix, wherein the common prefix ends immediately before a cycle in which a state according to the trace is different than a state according to the second trace; and guiding verification of the modified model using values derived from the common prefix.

Another exemplary embodiment of the disclosed subject matter is a computerized apparatus having a processor, the processor being adapted to perform the steps of: obtaining a trace exemplifying a checker failing in a model; obtaining a modified model, wherein the modified model is a modified version of the model which was modified in an attempt to resolve the checker failing in the model; re-simulating the trace in the modified model to generate a second trace, wherein said re-simulating is performed by a processor; comparing the trace and the second trace to identify a common prefix, wherein the common prefix ends immediately before a cycle in which a state according to the trace is different than a state according to the second trace; and guiding verification of the modified model using values derived from the common prefix Yet another exemplary embodiment of the disclosed subject matter is a computer program product comprising: a non-transitory computer readable medium retaining program instructions, which instructions when read by a processor, case the processor to performs the steps of: obtaining a trace exemplifying a checker failing in a model; obtaining a modified model, wherein the modified model is a modified version of the model which was modified in an attempt to resolve the checker failing in the model; re-simulating the trace in the modified model to generate a second trace, wherein said re-simulating is performed by a processor; comparing the trace and the second trace to identify a common prefix, wherein the common prefix ends immediately before a cycle in which a state according to the trace is different than a state according to the second trace; and guiding verification of the modified model using values derived from the common prefix.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

In the present disclosure, a "model" or a "design" is a definition of a circuit, processor, or similar computerized device having computational capabilities. The model may be defined using a hardware description language such as VHDL, Verilog, SystemC, or the like. The model may be manually defined (with or without the use of automatic tools) by an engineer.

One technical problem dealt with by the disclosed subject matter is to re-use products of the verification process of an original model to assist in verifying a modified version of the model. The modified version may be have been manually modified to correct a bug or modify a functionality based on a trace found during the verification process of the original model.

In the course of a verification project of a design, after receiving a counterexample trace that shows a fail of a checker, the causes of the fail are investigated and the model may be manually modified. Old counterexample traces, which used to hit the checker in the original model, may be re-simulated on the modified model. The re-simulation may be performed by providing, cycle by cycle, the inputs values of the trace to the new design. In some cases, re-simulation may search for a failure of the checker in the modified model.

However, in some cases, the modification may solve only the problem demonstrated by the trace, but not necessarily the root cause of the defect, so that the same trace would not reach the bug but the bug may still exist in other similar traces.

One technical solution is to identify a common prefix between the trace in the original model and the re-simulated trace in the modified model. The common prefix may be used to guide verification of the modified model. In some exemplary embodiments, the common prefix may be used to attempt exemplifying the checker failing in the modified model.

A trace may be a sequence of design states, in accordance with an execution or simulation of the model. Given a trace in the original model and a trace in the modified model, a last common state may be identified in both traces. The last common state may define the common prefix between the two traces. The common prefix or states therein may be used to guide verification. In some exemplary embodiments, a state from the prefix or based thereof may be used as a reset seed for the next verification run or otherwise defined as the initial state in the verification process. Additionally or alternatively, a state from the prefix or based thereof may be used to provide hints in semi-formal or non-formal verification methods.

In some exemplary embodiments, the last common state is one cycle prior to a difference between the two traces. The difference may be attributed to the modification of the model. Intuitively, additional traces having the same prefix may exemplify the same defect even if the defect is no longer exemplified when re-simulating the trace.

In some exemplary embodiments, the disclosed subject matter may be applied while avoiding over-fitting the guided verification process. In some exemplary embodiments, guidance may be based only on the values of the registers in the cone-of-influence of the checker. Additionally or alternatively, the guidance may be based only using signals that make a difference between the original and modified models. That is, the signal whose value is different in the state succeeding the last common state in both traces. Additionally or alternatively, instead of guiding the verification process using the last common state, a preceding cycle may be used. In some cases the preceding cycle may precede the last common state by k-steps, where k may be a user defined parameter. In some cases, the user defined parameter k may be no more than about five or no more than about ten. Greater values of k may be too far from the last common state and may therefore not be useful for guiding the verification process to a checker failure that is similar to that exhibited by the trace in the original model. Additionally or alternatively, a frontier of all states that are k steps prior to the last common state may be used as a set of initial states from which the verification process may be performed.

One technical effect of utilizing the disclosed subject matter may be providing hints useful for semi-formal methods. Semi-formal techniques may use hints that guide a semi-formal engine towards its targets such that a trace that shows a fail of the checker is generated. Such guided search hints may be manually provided by the FV engineer or automatically generated. Narrowing formal search to a reduced set of initial states is an effective under-approximation method that may be useful for very big models. The disclosed subject matter provides for automatic guidance that is based on actual bug in the previous version of the model and would therefore may prove useful.

Another technical effect is that the disclosed subject matter provides verification guidance that is based on the history and evolvement of the model. The disclosed subject matter may utilize past information that uncovered bugs found earlier in a project's life cycle. This may be especially useful at unit-level formal verification where projects last for weeks and consume thousands of verification iterations. Hints found may serve all future runs of the same checker.

Yet another technical effect is that the disclosed subject matter may provide for a reset seed for the next verification run based on the modification of the model. This may be helpful in reducing the verification search time.

Yet another technical effect is reusing counter example traces of a defect that was potentially not completely fixed. Re-usage of the counter-example is possible even in the modified model and even if re-simulation does not exhibit the defect.

Figure 1A:
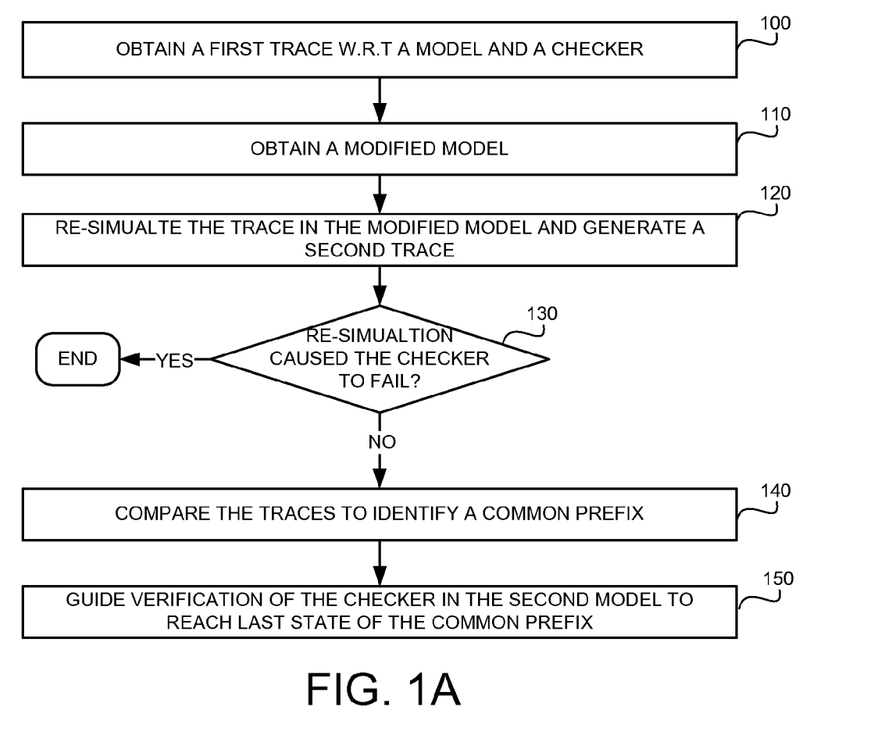
FIGS. 1A-1E show flowchart diagrams of steps in methods, in accordance with some exemplary embodiments of the disclosed subject matter.

Referring now to FIG. 1A showing a flowchart diagram of steps in a method, in accordance with some exemplary embodiments of the disclosed subject matter.

In Step 100, a first trace may be obtained. The trace may be a trace of execution (e.g., actual or simulated) of a model. The trace may exhibit a checker failing in the model. The trace may comprise valuations of signals of the model at each cycle until reaching the failure of the checker. In some exemplary embodiments, the trace may also indicate input values to the model.

In Step 110, a modified model may be obtained. The modified model may be a manually modified model that was manually fixed to overcome the bug. The modified model may have been modified by a designer of the model or by a similar engineer.

It will be noted that the modified model is not to be confused with a refined model during an abstraction-refinement verification process. The refined model is an automatic modification of an abstracted version of a model which attempts to provide a better abstraction that would not exhibit a spurious trace. The modified model should also not be confused with a modification in a bound of the same model, such as may be performed during SAT-based bounded model checking processes. In some exemplary embodiments, the model and the modified model may be unbounded models.

In Step 120, the trace may be re-simulated in the modified model. As a result of the re-simulation, a second trace may be generated. The re-simulation may be performed by providing at each cycle the same inputs that were provided to the original model. The inputs may be obtained from the trace and used during re-simulation.

In Step 130, it may be determined whether or not the re-simulation caused the checker to fail. In case the checker has failed, the second trace may be deemed as exhibiting the same defect as before the modification of the model. In case the checker did not fail during the re-simulation, Steps 140-150 may be preformed.

In Step 140, a common prefix may be identified in the two traces. The common prefix may be identified by examining the traces and identifying a first state in which the recorded values of signals are different in the second trace than what appears in the trace. The identified first state may be referred to as the first modified state. The common prefix may include all states prior to the identified state. In some exemplary embodiments, the comparison may be limited to sequential elements, such as flip flops, latches, registers, or the like. Additionally or alternatively, the comparison may be limited to signals or sequential elements within the cone of influence of the signals used by the checker. It may be useful to disregard modifications to the model that are not relevant to the checker, such as may be the case if several modifications were made to the model only some of which relate to the checker which failed in the trace.

In Step 150, the modified model may be verified. The verification of the modified model may be guided using the common prefix. In some exemplary embodiments, the verification may be guided to reach the last state of the common prefix (also referred to as the last common state). Additionally or alternatively, guidance may be provided to reach states that are similar to the last common state or to states preceding the last common state.

FIGS. 1B-1E exemplify different embodiments of the disclosed subject matter in which different guidance methods are utilized.

Figure 1B:
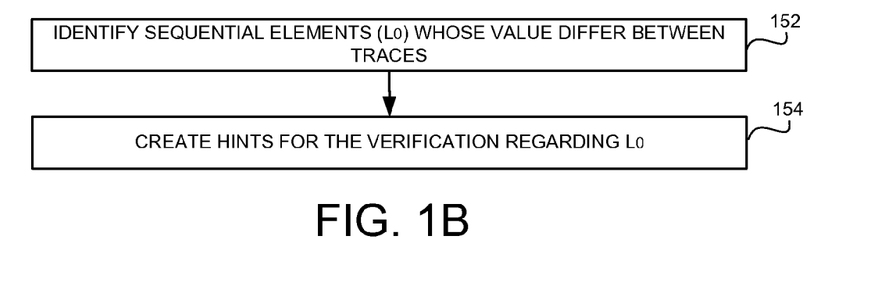

In Step 152 of FIG. 1B, a set of sequential elements, denoted as $L_0$, may be identified. $L_0$ may include all sequential elements whose values in the first modified state differ from the values of the corresponding state in the original trace. Put differently, $L_0$ includes the elements whose values indicate that the common prefix ends at the previous cycle. In some exemplary embodiments, $L_0$ may include only sequential elements that are in the cone of influence of the target checker.

In Step 154, hints may be created to guide the verification of the modified model. The hints may be based on the values of $L_0$ at each cycle up until the cycle of the last common state. In some exemplary embodiments, the hints may be used by non-formal verification engines to guide the verification process to cover the values indicated by the hints. In some exemplary embodiments, the hints may be used to generate input values that differ from the input values that were used in the trace but that cause the elements of $L_0$ to retain the same values as in the trace.

Figure 1C:
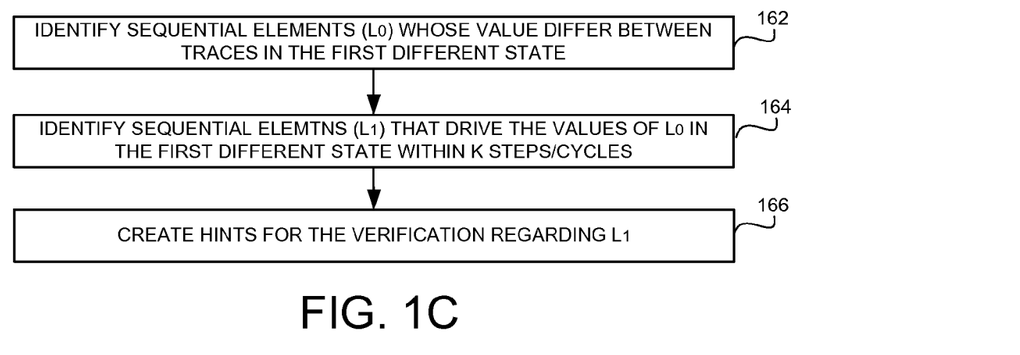

In Step 162 of FIG. 1C, a set of sequential elements whose value differs between traces in the first different state may be identified ($L_0$).

In Step 164, a set of sequential elements, denoted as $L_1$, that drive the values of $L_0$ may be identified. $L_1$ may drive the values of $L_0$ over k steps in a gate-level graph, such as within one gate, five gets, ten gates, or the like. Additionally or alternatively, k may denote a number of cycles, such as within a single cycle, within five cycles, or the like. In some exemplary embodiments, $L_1$ is within the cone of influence of $L_0$ of exactly k cycles or steps. Therefore, it may be assumed that the change in $L_0$ in the first modified state may be associated with the values of $L_1$ k cycles or steps prior to that and computation of $L_0$ in view of those values.

In Step 166, hints may be created for guiding a verification process based on the values of $L_1$. In some exemplary embodiments, the hints may be configured to guide the verification towards states in which the values of $L_1$ at the k-th cycle prior to the cycle of the first modified state are the same as recorded in the traces.

Figure 1D:
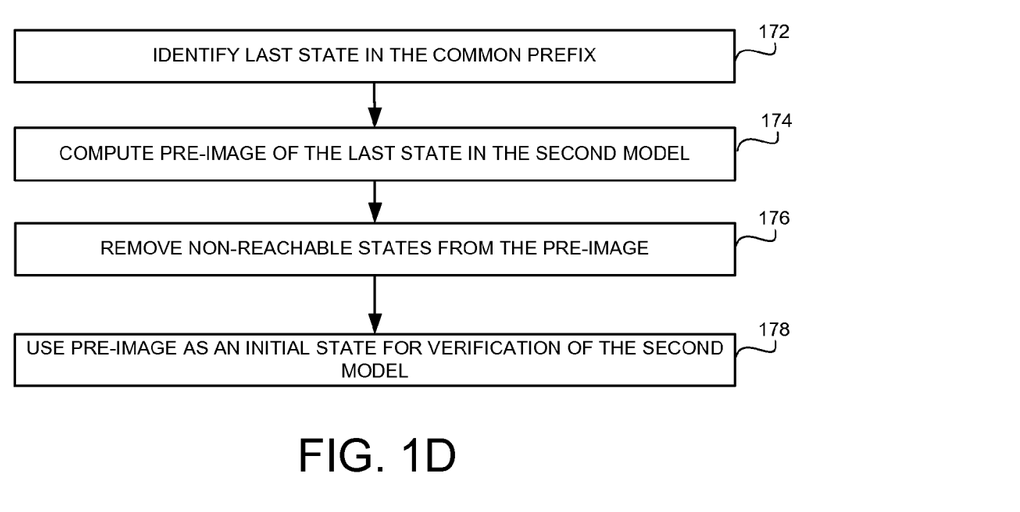
Figure 1E:
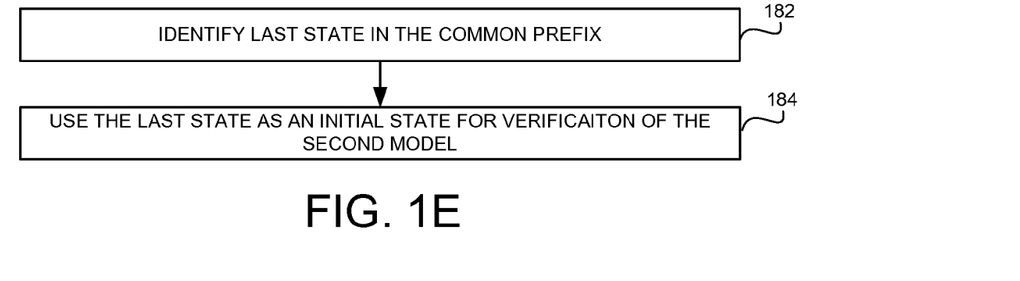

In Step 182 of FIG. 1E, the last common state may be identified.

In Step 184, the last common state may be used as an initial state for the verification process. In some exemplary embodiments, instead of using all values of the last common state, a partial state may be used, such as a state retaining only the values of $L_0$.

In Step 172 of FIG. 1D, the last common state may be identified.

In Step 174, a pre-image of the last state in the second model may be computed. In some exemplary embodiments, in case the second model has a transition relation denoted as TR, the pre-image of the state s in exactly one cycle may be symbolically computed using $TR^{-1}$ (s). In some exemplary embodiments, the pre-image may be computed for k cycles prior to the last common state, such as k cycles. The computation may be performed by repeatedly computing a pre-image of the pre-image k times. k may be any number, but may be limited by about five cycles in order to avoid a pre-image that is too large to be useful.

In Step 176, the pre-image may be filtered for unreachable states. States that are not reachable in the second model may be omitted from the pre-image as any bug that commences in them is spurious. Removal of non-reachable states may also assist in reducing the size of the pre-image to avoid state-space explosion during the verification process.

In Step 178, the pre-image may be used as the initial state of the verification process of the second model. In some exemplary embodiments, the pre-image may include a group of states each of which may be used as an initial state. In some exemplary embodiments, the pre-image (or portion thereof) may be used together as an initial state in a symbolic verification process, such as BDD-based model checking, SAT-based model checking, symbolic execution, or the like.

Figure 3:
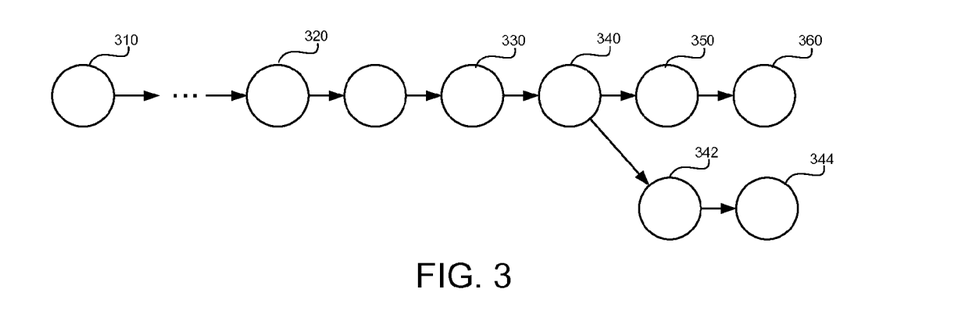
FIG. 3 shows a block diagram of components of an apparatus, in accordance with some exemplary embodiments of the disclosed subject matter.

Referring now to FIG. 3 showing an illustration of two traces in accordance with the disclosed subject matter.

States, such as 320, in a trace are illustrated as circles. Edges between states indicate a successive state. As an example, State 330 is followed by State 340.

FIG. 3 illustrates the first trace associated with the original model. The trace starts at State 310 through States 320, 330, 340, 350 and ends in State 360. In some exemplary embodiments, State 360 may exemplify a checker failing in the original model.

FIG. 3 also illustrates the second trace which is created during re-simulation of the trace in the modified model. As can be appreciated, the second trace also starts at State 310 and is identical to the trace until State 340. However, State 342 follows State 340 and not State 350 as in the first trace. It will be appreciated that the second trace may include a different number of states after State 340 than was observed in the first trace.

In the present example, the common prefix may be the states between State 310 and 340. State 340 may be a last common state even if State 360 and 344 (or other states that follow them) are also identical. State 342 may be the first modified state. It may be different than State 350 a value of at least one sequential element.

Figure 2:
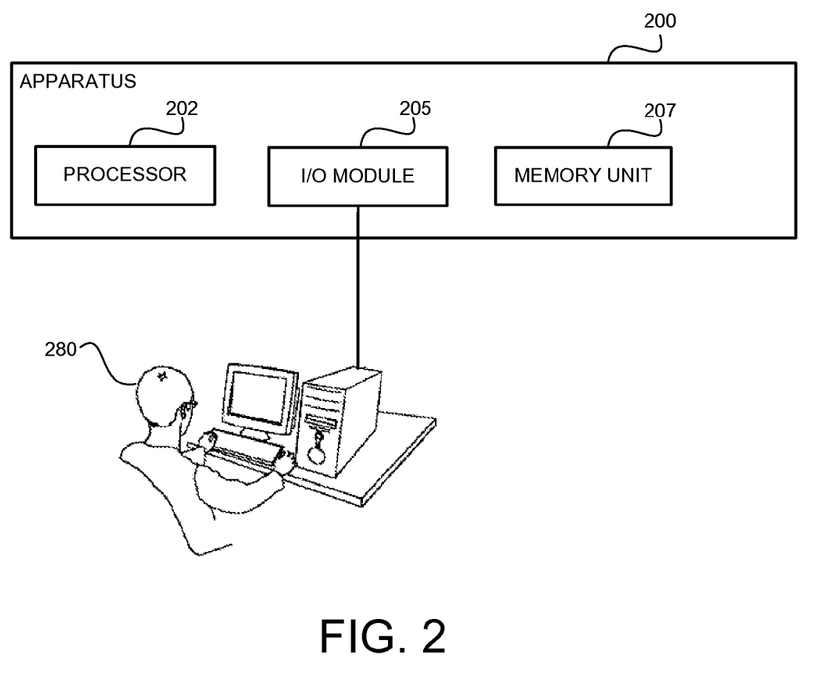
FIG. 2 shows a block diagram of components of an apparatus, in accordance with some exemplary embodiments of the disclosed subject matter.

Referring now to FIG. 2 showing a block diagram of components of an apparatus, in accordance with some exemplary embodiments of the disclosed subject matter. An Apparatus 200 may be a computerized apparatus adapted to perform a method such as depicted in FIGS. 1A-1E.

In some exemplary embodiments, Apparatus 200 may comprise a Processor 202. Processor 202 may be a Central Processing Unit (CPU), a microprocessor, an electronic circuit, an Integrated Circuit (IC) or the like. Alternatively, Apparatus 200 can be implemented as firmware written for or ported to a specific processor such as Digital Signal Processor (DSP) or microcontrollers, or can be implemented as hardware or configurable hardware such as field programmable gate array (FPGA) or application specific integrated circuit (ASIC). Processor 202 may be utilized to perform computations required by Apparatus 200 or any of it subcomponents.

In some exemplary embodiments of the disclosed subject matter, Apparatus 200 may comprise an Input/Output (I/O) Module 205 such as a terminal, a display, a keyboard, an input device or the like to interact with the system, to invoke the system and to receive results. It will however be appreciated that the system can operate without human operation. In some exemplary embodiments, a User 280, such as QA staff member, a verification engineer, a chip designer, an engineer, or the like, may interact with Apparatus 200 via a Man-Machine Interface (MMI). User 280 may operate Apparatus 200 such as identify the trace to be re-simulated, review simulation results, select a verification process to be used on the modified model, select one guidance technique to be used out of a plurality of potential guidance techniques such as a use of seed of initial states, use of hints for guiding non-formal verification engines, use of pre-image, use of $L_0$ values, use of $L_1$ values, combination thereof, or the like. In some exemplary embodiments, User 280 may modify the model to create the modified model that is simulated.

In some exemplary embodiments, Apparatus 200 may comprise a Memory Unit 207. Memory Unit 207 may be persistent or volatile memory. For example, Memory Unit 207 can be a Flash disk, a Random Access Memory (RAM), a memory chip, an optical storage device such as a CD, a DVD, or a laser disk; a magnetic storage device such as a tape, a hard disk, storage area network (SAN), a network attached storage (NAS), or others; a semiconductor storage device such as Flash device, memory stick, or the like. In some exemplary embodiments, Memory Unit 307 may retain program code operative to cause Processor 202 to perform acts associated with any of the steps shown in FIGS. 1A-1E. In some exemplary embodiments, Memory Unit 207 may retain the model, the modified model. Additionally or alternatively, Memory Unit 207 may retain traces, such as a trace of the original model in which the checker fails, a second trace in the modified model which is the outcome of re-simulation of the trace in the modified model, or the like. Additionally or alternatively, Memory Unit 207 may retain checkers, such as a checker which fails in the trace of the original model and does not fail in the second trace of the modified model, or the like.

An Embodiment

In one embodiment, the disclosed subject matter may implement the following pseudo-code:

Given a checker (target), a counterexample trace, and old design and a fixed (new) design, L denotes the set of sequential elements in the cone-of-influence of the target:

1. Re-simulate the fail trace on the fixed design by seeding input values of every cycle in the trace to the design.
2. If the checker is no longer hit by this trace we say that re-simulation fails.
2.1 Find the first clock cycle, C, where the state of the old design differs from the state of the new design. That is, time C-1 is the last time where the values stored in the sequential elements of L in the old design are equal to the values of the new design. We denote the values of L in cycle C-1 as the last common state of the old and the new design for the given trace.
3. Generate a hint equal to the values of L in this last common state.

Additionally or alternatively, the hint may include only assignment of elements in $L_0$. $L_0$ denotes a subset of L which includes all the set of sequential elements whose assignments in cycle C in the new design differs from their assignments in the old design.

Additionally or alternatively, the values of $L_1$ in C-k may be used as the last common state. $L_1$ denotes the set fan-in latches of $L_0$, that is the latches that drive $L_0$ (e.g., follow fan-in gates until the first latch is reached). k may be any positive values, but preferably is small. As an example, k may be 1, 2, 5 or the like.

Additionally or alternatively, the state may be computed for two or more different values of k. The several computed states may be ORed together to provide the state to be used preferably in a symbolic verification process.

In some exemplary embodiments, the 'last common state', which may be a union of states, may be used as an initial seed state for formal or semi formal engines. Different seed states can be used in different runs. Some or all of the states can be used as hints for guided search engines.

In some exemplary embodiments, the old and the new designs may be assumed to have equal sets of sequential elements and that the combinational equation of the target is the same. In some exemplary embodiments, the assumption is only with respect to the latches with in the cone of influence of the target. If latches were removed or added it may be enough to assume that the combinational logic that defines the target didn't change and that both simulations agree on the common latches in the cone-of-influence of the target. In some exemplary embodiments, mapping between the designs may be provided when the sequential elements have changed. In some exemplary embodiments, the disclosed subject matter may be used even when the above mentioned assumptions are not met.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   obtaining a trace exemplifying a checker failing in a model;
   obtaining a modified model, wherein the modified model is a modified version of the model which was modified in an attempt to resolve the checker failing in the model;
   re-simulating the trace in the modified model to generate a second trace, wherein said re-simulating is performed by a processor;
   comparing the trace and the second trace to identify a common prefix consisting a sequence of states, each state defining a value for each element in the model, wherein the common prefix ends immediately before a cycle in which a state according to the trace is different than a state according to the second trace; and
   guiding verification of the modified model using values derived from the common prefix.

2. The method of claim 1, wherein said guiding comprises: providing hints to guide a verification process towards a last state in the common prefix.

3. The method of claim 1, wherein said guiding comprises: setting a state as an initial state of a verification process, wherein the state is a non-initial state in the common prefix.

4. The method of claim 3, wherein the state being set as the initial state is a last state in the common prefix.

5. The method of claim 3, wherein the state being set as the initial state is a state that precedes a last state in the common prefix by no more than five cycles.

6. The method of claim 1, wherein said guiding is performed using values of sequential elements of the model in a last state of the common prefix.

7. The method of claim 1, wherein said guiding is performed using values of a subset ($L_0$) of sequential elements of the model; wherein the subset comprises sequential elements whose values in the trace and the second trace differ in a state succeeding a last state of the common prefix.

8. The method of claim 1, wherein said guiding is performed using values of a subset ($L_1$) of sequential elements of the model in a state of the common prefix, wherein the state precedes a last state of the common prefix; wherein the subset comprises sequential elements that drive values into sequential elements whose values in the trace and the second trace differ in a state succeeding the last state of the common prefix.

9. The method of claim 1, wherein said guiding comprises:
   identifying a last state of the common prefix;
   computing one or more pre-image for the last state to define a set of states; and
   verifying the modified model using the set of states as initial states of a verification process.

10. The method of claim 9 further comprising modifying the set of states to exclude states that are not reachable in the modified model.

11. The method of claim 1, wherein during said re-simulating the checker does not fail in the modified model.

12. The method of claim 1, wherein the model models a circuit design; and wherein the checker relates to a specification property of the circuit design.

13. The method of claim 1, wherein said guiding verification performs a verification process, wherein the verification process is selected from the group consisting of: a semi-formal verification process and a formal verification process.

14. A computerized apparatus having a processor, the processor being adapted to perform the steps of:
   obtaining a trace exemplifying a checker failing in a model;
   obtaining a modified model, wherein the modified model is a modified version of the model which was modified in an attempt to resolve the checker failing in the model;
   re-simulating the trace in the modified model to generate a second trace, wherein said re-simulating is performed by a processor;
   comparing the trace and the second trace to identify a common prefix consisting a sequence of states, each state defining a value for each element in the model, wherein the common prefix ends immediately before a cycle in which a state according to the trace is different than a state according to the second trace; and
   guiding verification of the modified model using values derived from the common prefix.

15. The computerized apparatus of claim 14, wherein said guiding comprises: providing hints to guide a verification process towards a last state in the common prefix.

16. The computerized apparatus of claim 14, wherein said guiding comprises: setting a state as an initial state of a verification process, wherein the state is a non-initial state in the common prefix.

17. The computerized apparatus of claim 16, wherein the state being set as the initial state is a state that precedes a last state in the common prefix by no more than five cycles.

18. The computerized apparatus of claim 14, wherein said guiding is performed using values of sequential elements of the model in a last state of the common prefix.

19. The computerized apparatus of claim 14, wherein said guiding comprises:
   identifying a last state of the common prefix;
   computing one or more pre-image for the last state to define a set of states; and
   verifying the modified model using the set of states as initial states of a verification process.

20. A computer program product comprising:
   a non-transitory computer readable medium retaining program instructions, which instructions when read by a processor, case the processor to performs the steps of:
   obtaining a trace exemplifying a checker failing in a model;
   obtaining a modified model, wherein the modified model is a modified version of the model which was modified in an attempt to resolve the checker failing in the model;
   re-simulating the trace in the modified model to generate a second trace, wherein said re-simulating is performed by a processor;
   comparing the trace and the second trace to identify a common prefix consisting a sequence of states, each state defining a value for each element in the model, wherein the common prefix ends immediately before a cycle in which a state according to the trace is different than a state according to the second trace; and
   guiding verification of the modified model using values derived from the common prefix.

* * * * *